United States Patent
Zhu et al.

(10) Patent No.: US 11,107,402 B2
(45) Date of Patent: Aug. 31, 2021

(54) DISPLAY SCREEN, DISPLAY DEVICE INTEGRATED WITH DISPLAY SCREEN, AND COVER PLATE

(71) Applicant: YUNGU (GU'AN) TECHNOLOGY CO., LTD., Langfang (CN)

(72) Inventors: Ke Zhu, Kunshan (CN); Liping Shen, Kunshan (CN); Xinnan Wang, Kunshan (CN); Lin Xu, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 0 days.

(21) Appl. No.: 16/994,675

(22) Filed: Aug. 17, 2020

(65) Prior Publication Data
US 2020/0380917 A1 Dec. 3, 2020

Related U.S. Application Data

(63) Continuation of application No. PCT/CN2019/090212, filed on Jun. 5, 2019.

(30) Foreign Application Priority Data

Nov. 7, 2018 (CN) .......................... 201811320099.8

(51) Int. Cl.
G09G 5/10 (2006.01)
G09G 3/3233 (2016.01)
(Continued)

(52) U.S. Cl.
CPC ......... *G09G 3/3233* (2013.01); *G09G 3/3216* (2013.01); *H01L 27/3234* (2013.01);
(Continued)

(58) Field of Classification Search
CPC .. G09G 3/3233; G09G 3/3216; G09G 3/3225; G09G 3/3275; G09G 2320/02;
(Continued)

(56) References Cited

U.S. PATENT DOCUMENTS 10,388,680 B2 8/2019 Zheng et al.
10,586,511 B2 3/2020 Yang et al.
(Continued)

FOREIGN PATENT DOCUMENTS

CN 107146573 A 9/2017
CN 107577078 A 1/2018
(Continued)

OTHER PUBLICATIONS

International Search Report of International Application No. PCT/CN2019/090212.
Office Action of Chinese Patent Application No. 201811320099.8.

*Primary Examiner* — Jennifer T Nguyen
(74) *Attorney, Agent, or Firm* — Kilpatrick Townsend & Stockton

(57) ABSTRACT

A display panel including a first display area, a display transition area, and a second display area is provided. A first type of the first display area is different from a second type of the second display area. The first display area and the second display area are disposed at two opposite sides of the display transition area. The display transition area includes a plurality of display transition unit areas extending in a direction from the first display area to the second display area. The plurality of display transition unit areas are sequentially arranged adjacent to one another. In a full-screen display, luminance of the first display area, the plurality of display transition unit areas and the second display area display increases or decreases sequentially, and luminance of different display transition unit areas is different.

20 Claims, 4 Drawing Sheets

(51) Int. Cl.
*G09G 3/3216* (2016.01)
*H01L 27/32* (2006.01)

(52) U.S. Cl.
CPC . *H01L 27/3267* (2013.01); *G09G 2310/0232* (2013.01); *G09G 2320/0233* (2013.01); *G09G 2320/0686* (2013.01)

(58) Field of Classification Search
CPC ... G09G 2320/0285; G09G 2320/0626; G09G 2320/0233; G09G 2320/02686; G09G 2310/0232; H01L 27/3234; H01L 27/14603; H01L 27/3211; H01L 27/3213
USPC .......................................... 345/76, 690, 694
See application file for complete search history.

(56) References Cited

U.S. PATENT DOCUMENTS

| | | | |
|---|---|---|---|
| 2015/0029208 A1* | 1/2015 | Kim | G09G 3/2092 345/590 |
| 2016/0078807 A1* | 3/2016 | Sun | G09G 3/3233 345/204 |
| 2016/0120005 A1 | 4/2016 | Wu et al. | |
| 2018/0012566 A1* | 1/2018 | Lin | G09G 5/10 |
| 2018/0374426 A1* | 12/2018 | Chen | G09G 5/10 |
| 2019/0164521 A1* | 5/2019 | Feng | G09G 3/3208 |
| 2019/0326366 A1 | 10/2019 | Fan et al. | |
| 2019/0340974 A1* | 11/2019 | Ka | G09G 3/3225 |
| 2020/0034100 A1 | 1/2020 | Fan et al. | |
| 2020/0052059 A1* | 2/2020 | Chen | H01L 27/3213 |
| 2020/0279090 A1* | 9/2020 | He | G06K 9/00087 |

FOREIGN PATENT DOCUMENTS

| | | |
|---|---|---|
| CN | 107731099 A | 2/2018 |
| CN | 107731159 A | 2/2018 |
| CN | 107819020 A | 3/2018 |
| CN | 107845663 A | 3/2018 |
| CN | 107919087 A | 4/2018 |
| CN | 207264695 U | 4/2018 |
| CN | 207781599 U | 8/2018 |
| CN | 207947007 U | 10/2018 |
| CN | 109581749 A | 4/2019 |

* cited by examiner

DISPLAY SCREEN, DISPLAY DEVICE INTEGRATED WITH DISPLAY SCREEN, AND COVER PLATE

CROSS REFERENCE TO RELATED APPLICATIONS

This application is a continuation application of International Application PCT/CN2019/090212, filed on Jun. 5, 2019, which claims priority to Chinese Patent Application No. 201811320099.8, filed on Nov. 7, 2018, entitled "DISPLAY PANEL AND DISPLAY TERMINAL", the disclosure of both applications are hereby incorporated by reference in their entirety.

TECHNICAL FIELD

The present disclosure relates to the field of display technology.

BACKGROUND

With the rapid development of electronic devices, users' expectations for the screen-to-body ratio are higher and higher, so that a full-screen display of electronic device has attracted more and more attention from the industry.

Due to a need to integrate components such as a front camera, an earphone, and an infrared sensing element, etc., conventional electronic devices such as a mobile phone, a tablet computer, etc. are necessary to be notched or to provide an opening in a display panel thereof to arrange these components in a notched area or an opening area. However, neither the notched area nor the opening area can be used to display a picture. Therefore, improved systems and methods are desired.

SUMMARY

An aspect of the present disclosure provides a display panel. The display panel includes a first display area; a display transition area having a plurality of display transition unit areas; and a second display area, a second type of the second display area being different from a first type of the first display area; wherein, the first display area and the second display area are disposed at two opposite sides of the display transition area respectively; in a direction from the first display area to the second display area, the display transition unit areas are sequentially arranged adjacent to one another; and in a full-screen display, luminance of the first display area, luminance of the display transition unit area and luminance of the second display area change sequentially, and luminance of the display transition unit areas are different.

In an optional embodiment, the first type of the first display area and a third type of the display transition area are identical.

In an optional embodiment, in the full-screen display, the luminance of the first display area is greater than the luminance of the second display area; and luminance of the display transition area is less than the luminance of the first display area.

In an optional embodiment, in the direction from the first display area to the second display area, luminance of the display transition unit areas decreases sequentially.

In an optional embodiment, a pixel aperture ratio of the display transition area is less than a pixel aperture ratio of the first display area.

In an optional embodiment, in the direction from the first display area to the second display area, pixel aperture ratios of the display transition unit areas decrease sequentially.

In an optional embodiment, a pixel density of the display transition area is less than a pixel density of the first display area.

In an optional embodiment, in the direction from the first display area to the second display area, pixel densities of the display transition unit areas decrease sequentially.

In an optional embodiment, the display panel is provided with a first drive Thin-Film Transistor (TFT) and a plurality of second drive TFTS; a channel width-to-length ratio of the first drive TFT is greater than a channel width-to-length ratio of each of the second drive TFTS; the first drive TFT is a drive TFT in a pixel driving circuit that drives the first display area; and the second drive TFTS are drive TFTS in a pixel driving circuit that drive the display transition unit areas.

In an optional embodiment, in the direction from the first display area to the second display area, the channel width-to-length ratios of the second drive TFTS configured to drive the display transition unit area decrease sequentially.

In an optional embodiment, the second type of the second display area and a third type of the display transition area are identical.

In an optional embodiment, in the full-screen display, a luminance difference between adjacent display transition unit areas is greater than 1 nit.

In an optional embodiment, the first display area is an Active Matrix OLED (AMOLED) display area, and the second display area is a Passive Matrix OLED (PMOLED) display area or an AMOLED-like display area.

In an optional embodiment, the display transition area is an AMOLED display area, and the display transition area is provided with at least one row or one column of sub-pixel area.

In an optional embodiment, the second display area is partially or wholly surrounded by the first display area.

In an optional embodiment, the second display area is not surrounded by the first display area.

In an optional embodiment, the first display area is a Passive Matrix OLED (PMOLED) display area, and the second display area is an Active Matrix OLED (AMOLED) display area.

In an optional embodiment, the display transition area is a PMOLED display area; the display transition area is provided with at least one row or one column of pixel unit area; and the pixel unit area is a pixel area driven by a same anode structure.

Another aspect of the present disclosure provides a display terminal, including:

a device body having a component area;

any one of the display panels above; the display panel is provided on the device body;

the component area is disposed below the second display area; a photosensitive component is arranged in the component area; and the photosensitive component receives light passing through the second display area.

In an optional embodiment, the photosensitive component includes a camera and/or a sensor.

DETAILED DESCRIPTION OF THE EMBODIMENTS

Figure 1:
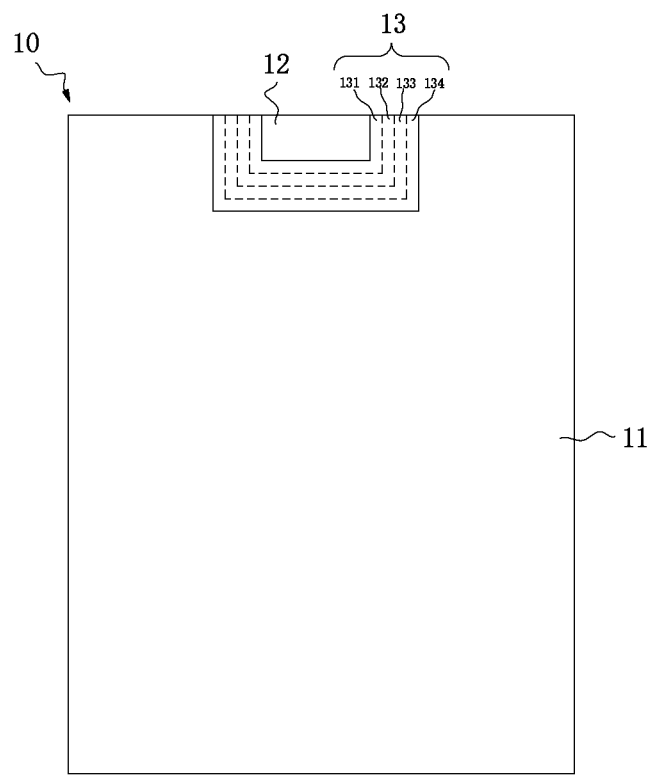
FIG. 1 is a schematic structural diagram illustrating a display panel of an optional embodiment.

As explained above, there are various drawbacks with conventional displays. For example, these displays are not full-screen in a true sense, and cannot display a picture in all areas of the entire screen. For example, the picture cannot be displayed in the camera area. Additionally, there is a large luminance difference among different display areas.

Various embodiments disclosed by the present disclosure provide a display panel and a display terminal to effectively improve a luminance difference at a boundary of adjacent display areas in the display panel, thereby improving the display performance of the display panel and the display terminal.

For the convenience of understanding the present disclosure, exemplary embodiments of the present disclosure will be described more comprehensively below with reference to related accompany drawings. The present disclosure can be implemented in many different forms and is not limited to the embodiments described herein. Rather, these embodiments are provided to make the content of the present disclosure more thoroughly and comprehensively understood.

Due to a need to integrate a component, such as a front camera, an earphone and an infrared sensing element, etc. to an electronic device such as a mobile phone, a tablet computer, etc., a notched area can be disposed in a display screen, so as to arrange the camera, the earphone, the infrared sensing element and the like in the notched area. However, such a notched area cannot be used to display a picture. Optionally, a photography function of the electronic device is achieved by opening a hole in the screen. In this way, external light can enter into the photosensitive element located below the screen through the hole in the screen. However, these electronic devices are not full-screen in true sense, and cannot display a picture in all areas of the entire screen. For example, the picture cannot be displayed in the camera area.

As described above, exemplary embodiments of the present disclosure provide a display screen which achieves a full-screen display of the electronic device by providing a transparent display panel within the notched area. According to different driving methods, Organic Light-Emitting Diode (OLED) can be classified into Passive Matrix OLED (PMOLED, passively driven organic light-emitting diode) and Active Matrix OLED (AMOLED, actively driven organic light-emitting diode). Taking a PMOLED for example, the display units in a row of a display array of the PMOLED share electrodes having same properties, and the display units in a column share electrodes having same properties. Specifically, a PMOLED display panel forms a matrix by cathodes and anodes, and illuminates pixels in the array in a scanning manner. Each pixel is operated in a short pulse mode, thus generating an instant high-luminance light emission. Since the PMOLED display panel is not provided with a thin film transistor (TFT) backplane and a metal wiring, a light transmittance thereof is high, and the PMOLED display panel can be used as the aforementioned transparent display panel within the notched area.

As a display panel uses a panel, such as a PMOLED display panel and an AMOLED display panel, to achieve a full-screen display, since the driving methods, device structures of the PMOLED display panel and an AMOLED display panel are quite different, there is an obvious difference between luminance of the display areas corresponding to the two display panels, which will further cause an obvious boundary between the two display areas or even a black line in the full-screen display to reduce a display effect of the full screen greatly.

In order to solve the mentioned problems, the exemplary embodiment of the present disclosure creatively proposes that a display transition area is disposed between the adjacent display areas having a luminance difference, the luminance of the display transition area is between that of the two adjacent display areas, and the display transition area is provided with a plurality of display transition unit areas with luminance smoothly changed, thereby weakening and even eliminating a display boundary between the two display areas to avoid the defect of the black line in the full-screen display, and improving the display of the full screen.

FIG. 1 is a schematic structural diagram illustrating a display panel of an optional embodiment. As shown in FIG. 1, in an optional embodiment, the display panel 10 has a plurality of display areas, such as a first display area 11, a second display area 12, a display transition area 13, and the like. When the first display area 11 and the second display area 12 are used for the full-screen display, there is a certain luminance difference therebetween. The display transition area 13 is disposed at an area between the first display area 11 and the second display area 12. In a direction extending from the second display area 12 to the first display area 11, the display transition area 13 can include at least two display transition areas that are sequentially arranged adjacent to one another. In the embodiment shown in FIG. 1, the display transition area 13 includes a first display transition unit area 131, a second display transition unit area 132, a third display transition unit areas 133, and a fourth display transition unit area 134. The number of the display transition unit areas can be two, three, four, five, and so on. The specific number of the display transition unit areas can be adaptively adjusted according to the luminance difference between the first display area 11 and the second display area 12 and actual demand. In the embodiments of the present disclosure, the specific number of display transition unit areas is not particularly limited.

As shown in FIG. 1, when the display transition area 13 together with the first display area 11 and the second display area 12 is used for the full-screen display (that is, a same screen display), the luminance of the display transition area 13 is between the luminance of the first display area 11 and the luminance of the second display area 12, and the luminance of the first display transition unit area 131, the second display transition unit area 132, the third display transition unit area 133, and the fourth display transition unit 134 also smoothly changes. For example, in a full-screen display, the luminance of the first display transition unit area 131 is greater than the luminance of the second display area 12, the luminance of the second display transition unit area 132 is greater than the luminance of the first display transition unit area 131, the luminance of the third display transition unit area 133 is greater than the luminance of the second display transition unit area 132, the luminance of the fourth display transition unit area 134 is greater than the luminance of the third display transition unit area 133, and the luminance of the first display area 11 is greater than the luminance of the fourth display transition unit area 134. Or the luminance of the first display transition unit area 131 is less than the luminance of the second display area 12, the luminance of the second display transition unit area 132 is less than the luminance of the first display transition unit area 131, the luminance of the third display transition unit area 133 is less than the luminance of the second display transition unit area 132, the luminance of the fourth display transition unit area 134 is less than the luminance of the third display transition unit area 133, and the luminance of the first display area 11 is less than the luminance of the fourth display transition unit area 134. In other words, in a full-screen display, the luminance between the second display area 12, the first display transition unit area 131, the second display transition unit area 132, the third display transition unit area 133, the fourth display transition unit area 134 and the first display area 11 smoothly increases or decreases, accordingly, the above defect occurring in a case that the first display area 11 and the second display area 12 are used for the full-screen display is reduced or even eliminated by providing the display transition area 13, thereby improving the full-screen display.

In an optional embodiment, in the full-screen display, each luminance difference between adjacent display transition unit areas can be identical or different, but the luminance difference between any two adjacent display transition unit areas should be greater than 1 nit, such as, 3 int, 5 int, 7 int, etc. As shown in FIG. 1, in a full-screen display, the luminance difference between the first display transition unit area 131 and the second display area 12, the luminance difference between the second display transition unit area 132 and the first display transition unit area 131, the luminance difference between the third display transition unit area 133 and the second display transition unit area 132, the luminance difference between the fourth display transition unit area 134 and the third display transition unit area 133, the luminance difference between the first display area 11 and the fourth display transition unit area 134 are all 3 nit, thus the luminance of the display transition area 13 presents a smooth change, thereby further eliminating the luminance boundary between adjacent display areas, and improving the display of the display panel.

In an optional embodiment, as shown in FIG. 1, the type of the display transition area 13 can be identical to the type of the first display area 11 or the type of the second display area 12. By technical solutions such as adjusting the pixel aperture ratio or a pixel density, etc. to change a unit display area of each display transition unit area in the display transition area 13, and/or, adjusting the channel width-to-length ratio of the TFT device in the driving circuit of the display transition area 13, etc. Thus, the luminance of the display transition unit areas in the display transition area 13 is between the luminance of the first display area 11 and the luminance of the second display area 12, and in the extending direction from the second display area 12 to the first display area 11, the luminance between the first display area 11 and the display transition area 13, the luminance between the second display area 12 and the display transition area 13, the luminance between adjacent transition unit areas present a smooth change, so as to further improve the luminance difference boundary between adjacent display areas.

Figure 2:
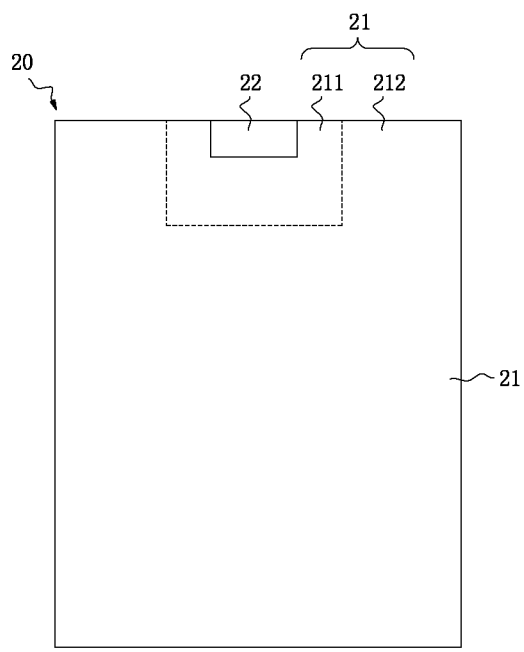
FIG. 2 is a schematic diagram illustrating a display transition area disposed in a main display area of an optional embodiment.

FIG. 2 is a schematic diagram illustrating a display transition area disposed in a main display area of an optional embodiment. As shown in FIG. 2, the display panel 20 has a main display area 21 and a second display area 22, and the second display area 22 can be either partially (as shown in FIG. 2) or wholly (not shown) surrounded by the main display area 21. Optionally, the second display area 22 may not be surrounded by the main display area 21. The main display area 21 can include a display transition area 211 and a first display area 212, that is, the display transition area 211 and the first display area 212 are display areas of a same type formed on a same substrate. Therefore, the second display area 22 and the first display area 212 are different types of display areas, and the driving methods, device structures, etc. thereof are quite different. If the second display area 22 and the first display area 212 are arranged directly adjacent to one another, then there will be a certain luminance difference therebetween when they are used for a full-screen display in a same screen. In the embodiment shown in FIG. 2, when the luminance of the first display area 212 is higher than the luminance of the second display area 22, based on the first display area 212, the display transition area 211 can be arranged as the display transition unit areas are arranged in a way shown in FIG. 1, so as to reduce the luminance of the display transition area 211 by reducing the pixel aperture ratio, the pixel density, or the channel width-to-length ratio of the TFT device in the pixel driving circuit, etc. As a result, in a full-screen display, the luminance of the display transition area 211 is between the luminance of the second display area 22 and the luminance of the first display area 212, and that each luminance between the adjacent display transition unit areas in the display transition area 211 (not shown in FIG. 2) also presents a smooth change, thereby further improving the luminance difference boundary between the adjacent display areas. When the luminance of the first display area 212 is lower than the luminance of the second display area 22, based on the first display area 212, the display transition area 211 can increase the luminance of the display transition area 211 by increasing the pixel aperture ratio, the pixel density, or the channel width-to-length ratio of the TFT device in the pixel driving circuit. Therefore, the luminance between the adjacent display transition unit areas presents a smooth change, and in a full-screen display, the luminance of the display transition area 211 is between the luminance of the second display area 22 and the luminance of the first display area 212.

Figure 3:
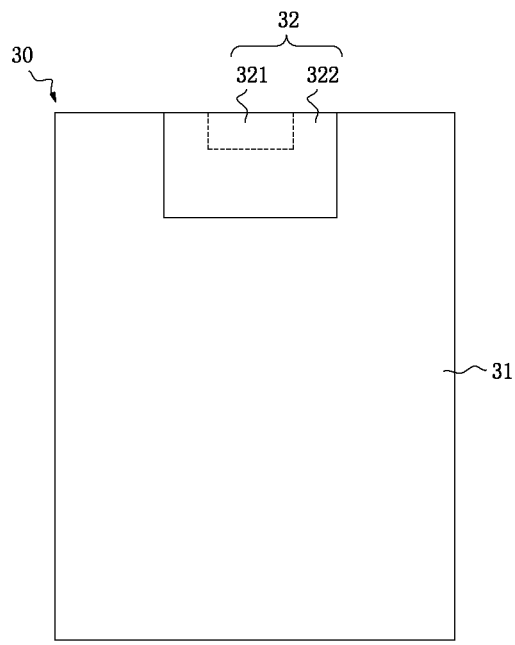
FIG. 3 is a schematic diagram illustrating a display transition area disposed in a secondary display area of an optional embodiment.

FIG. 3 is a schematic diagram illustrating a display transition area disposed in a secondary display area of an optional embodiment. As shown in FIG. 3, the display panel 30 has a first display area 31 and a secondary display area 32, and the secondary display area 32 can be partially (as shown in FIG. 3) or wholly (not shown) surrounded by the first display area 31. Alternatively, the secondary display area 32 may not be surrounded by the first display area 31. The secondary display area 32 can include a second display area 321 and a display transition area 322, that is, the display transition area 322 and the second display area 321 are display areas of a same type formed on a same substrate. Therefore, since the first display area 31 and the second display area 321 are different types of display areas, and the driving methods, component structures, etc. thereof are quite different, there will be a certain luminance difference therebetween when they are used for a full-screen display in the same screen. For example, as shown in FIG. 3, when the luminance of the second display area 321 is higher than the luminance of the first display area 31, based on the second display area 321, the display transition area 322 can reduce the luminance of the display transition area 322 by reducing the pixel aperture ratio, the pixel density, or the channel width-to-length ratio of the TFT device in the pixel driving circuit, etc. As a result, in a full-screen, the luminance of the display transition area 322 is between the luminance of the first display area 31 and the luminance of the second display area 321, and that the luminance of the adjacent display transition unit areas (not shown in FIG. 3) disposed in the display transition area 322 can present a smooth change in the direction from the first display area 31 to the second display area 321. For arrangement of the display transition unit areas, please refer to the display transition unit areas arranged in FIG. 1. When the luminance of the second display area 321 is lower than the luminance of the first display area 31, based on the second display area 321, the display transition area 322 can be arranged as the display transition unit areas are arranged in a way shown in FIG. 1, so as to increase the luminance of the display transition area 322 by increasing the pixel aperture ratio, the pixel density, or the channel width-to-length ratio of the TFT device in the pixel driving circuit, etc. Therefore, the luminance between the adjacent display transition unit areas (referring to the display transition unit areas 131, 132, 133, 134 arranged in FIG. 1) in the display transition area 322 also present a smooth change, so that, in a full-display, the luminance of the display transition area 322 is between the luminance of the first display area 31 and the luminance of the second display area 321.

In an optional embodiment, a transparent display panel such as an OLED or a liquid crystal display (LCD) can be provided in the first display area. The second display area can be provided with a PMOLED display area or an AMOLED-like display area, and the first display area can be provided with an AMOLED display area.

In an optional embodiment, the above display panel can be a transparent display screen. The display panel can include a plurality of film layers. In order to ensure the transparency of the display panel, light transmittance of each film layer can be greater than 90%, and light transmittance of the display panel can be greater than 70%. For example, the light transmittance of each film layer is 91%, 93%, 95%, 97%, 98%, or 99%, etc., and the light transmittance of the display panel is 70%, 75%, 80%, 85%, 90% or 95%, etc. The above light transmittance can be determined according to actual needs and process capabilities. At the same time, a pixel definition layer and a planarization layer in the display panel can also made of a material with high light transmittance, as long as the above film layers can ensure the transparency of the display panel.

In another optional embodiment, the material of the pixel definition layer in the above display panel with transparent property can be a light-blocking material configured to improve diffraction formed by the display module in the pixel aperture on the pixel definition layer. Moreover, in order to ensure the transparency of the display panel, the light transmittance of each film layer in the above display panel can be greater than 90% (such as 90%, 92%, 94%, 95% or 98%, etc.), and the light transmittance of the entire display panel is greater than 70% (such as 70%, 76%, 80%, 88%, or 98%, etc.). In addition, a material of a conductive film layer in the display panel can be ITO, IZO, ITO doped with Ag, or IZO doped with Ag, etc., and a material of an insulating film layer in the transparent display panel can be transparent insulating materials, such as $SiO_2$, $SiN_x$ and $Al_2O_3$, to further ensure the light transmittance of the display panel.

Figure 4:
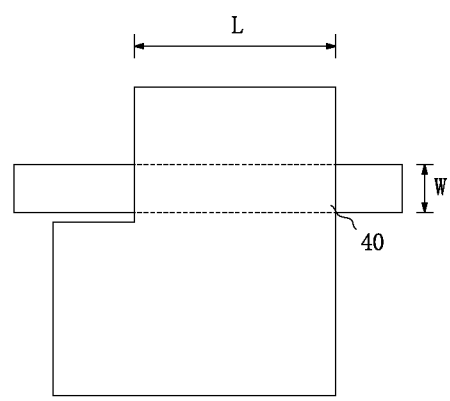
FIG. 4 is a schematic diagram illustrating a channel of a TFT device of an optional embodiment.

FIG. 4 is a schematic diagram illustrating a channel of a TFT device of an optional embodiment. As shown in FIG. 4 and referring to FIG. 2, in an optional embodiment, the main display area 21 can be an AMOLED display area, and the second display area 22 can be a PMOLED display area. The luminance of the OLED device has a positive relationship with an output current of the driving TFT device, and a formula of the output current of the driving TFT device $I_{OLED}$ is:

$$I_{OLED} = \frac{1}{2}\mu_n C_{ox} \frac{W}{L}(V_{GS} - V_{TH})^2$$

where $\mu_n$ is an electron mobility of the driving TFT, $C_{ox}$ is capacitance of a gate oxide layer per unit area, $V_{GS}$ is a gate source voltage, $V_{TH}$ is a threshold voltage, W is a width of a channel 40 of the driving TFT device, and L is a length of the channel 40 of the driving TFT device.

As shown in FIGS. 2 and 4, based on the above current formula, it can be seen that the channel width-to-length ratio of the driving TFT device can be increased by increasing the width W of the channel 40 of the driving TFT device and/or reducing the length L of the channel 40 of the driving TFT device, in turn, the output current of the driving TFT device is increased, to achieve the purpose of improving the luminance of the display area. Correspondingly, the channel width-to-length ratio of the driving TFT device can also be reduced by reducing the width W of the channel 40 of the driving TFT device and/or increasing the length L of the channel 40 of the driving TFT device, in turn, the output current of the driving TFT device is reduced, so as to achieve the purpose of reducing the luminance of the display area. That is, by changing the channel width-to-length ratio (W/L) of the driving TFT device, the output current of the driving TFT device is changed, so that, under the premise of a same data signal, the luminance of the display transition area 211 is between the luminance of the second display area 22 and the luminance of the first display area 212.

In an optional embodiment, if the display transition area in the above embodiment is an AMOLED display area, then the display transition area is provided with at least one row or one column of sub-pixel areas. If the display transition area is a PMOLED display area, the display transition area is provided with at least one row or one column of pixel unit areas, and the aforementioned pixel unit areas are driven by a same anode structure to ensure good display of the display transition area.

Figure 5:
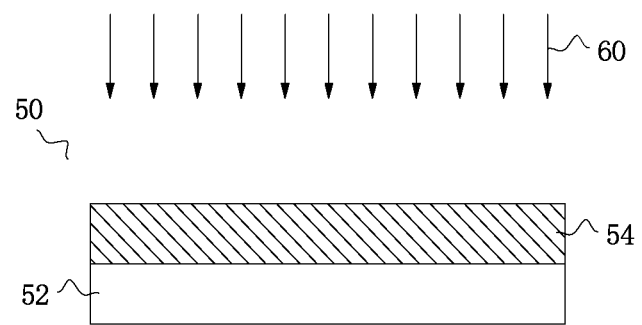
FIG. 5 is a schematic structural diagram illustrating a display terminal of an embodiment.

FIG. 5 is a schematic structural diagram illustrating a display terminal of an embodiment. As shown in FIG. 5, an exemplary embodiment of the present disclosure further provides a display terminal 50. The display terminal 50 can include a device body 52 and a display panel 54. The display panel 54 is disposed on the device body 52, and the device body 52 and the display panel 54 are electrically connected to each other. The display panel 54 can be any one of the above embodiments, and is configured to display according to data or signals sent by the device body 52, and/or to control the device body 52 to perform an operation according to a user's manipulation.

Figure 6:
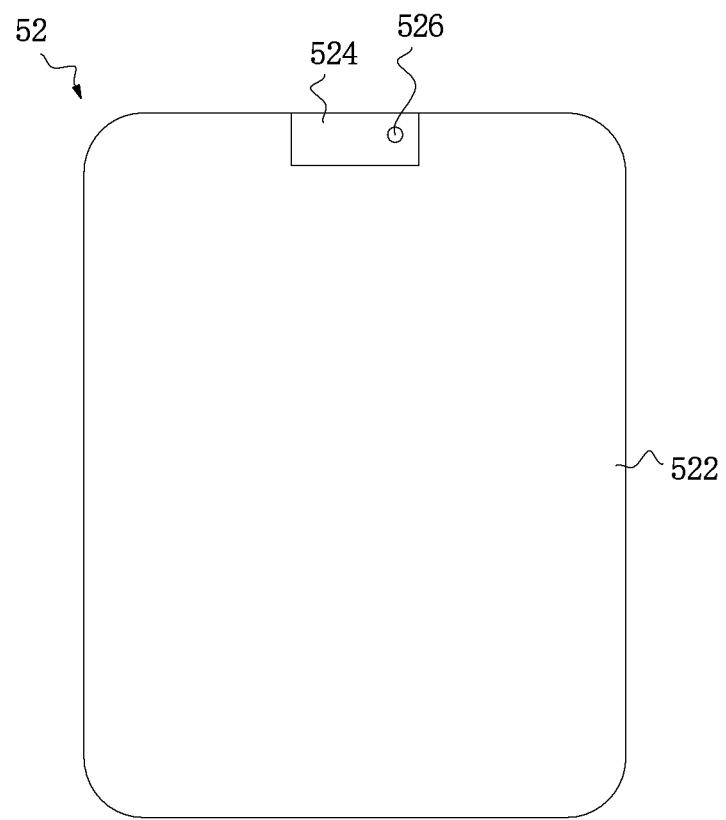
FIG. 6 is a schematic structural diagram illustrating the device body shown in FIG. 5.
Figure 7:
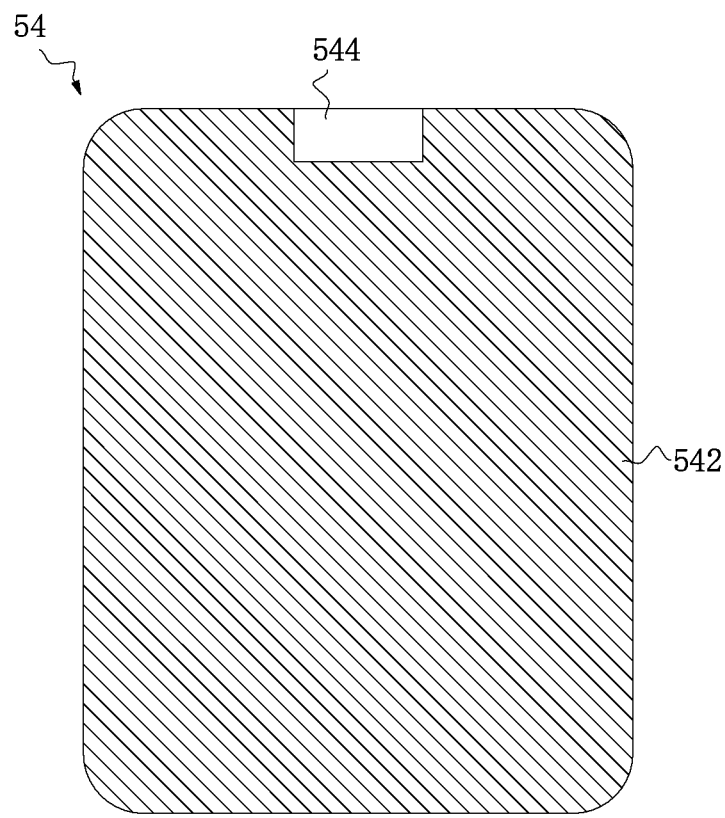
FIG. 7 is a schematic structural diagram illustrating the display panel shown in FIG. 5.

Referring to FIG. 6, a schematic structural diagram illustrating the device body 52 shown in FIG. 5, specifically, a non-component area 522 and a component area 524 can be arranged on the device body 52 described above. A photosensitive component such as a camera 526 or a light sensor can be provided in the component area 524. Referring to FIG. 7, a schematic structural diagram illustrating the display panel 54 shown in FIG. 5, the above display panel 54 can include a second display area 544 (or secondary display area) and a first display area 542 (or main display area). As shown in FIGS. 5-7, when the display panel 54 is fixed to the device body 52, the first display area (such as the notched area) 544 is correspondingly attached to the component area 524 shown in FIG. 6, so that an external light 60 can pass through the first display area 544 to be received and sensed by the photosensitive component. When the above display panel 54 is the display panel of any embodiment of the present disclosure, the display transition area (not shown in the figure) is arranged at a position in the first display area 542 adjacent to the second display area 544, so that, in a full-screen display, the display luminance of the first display area 542, the display transition area and the second display area 544 can change smoothly, and the luminance of the display transition unit areas disposed in the display transition area also changes smoothly, and that the luminance between the adjacent display areas can present a smooth change, thereby effectively avoiding defects such as black lines, etc. caused by an excessive large luminance difference between adjacent display transition unit areas, thereby improving the display effect of the display screen in the display terminal.

In addition, as shown in FIG. 7, in order to improve the light transmission performance of the aforementioned second display area 544, the display panel in the second display area 544 can be configured to be a transparent display panel. In this way, when the photosensitive component is operating, the second display area 544 can be in a non-display state, thereby improving the light transmittance of the second display area 544.

In another optional embodiment, the display panel in the second display area 544 is a PMOLED display panel or an AMOLED-like display panel. The display panel in the first display area 542 is an AMOLED display panel. The AMOLED-like display panel refers to a display panel that a pixel circuit thereof includes only one switching element (i.e., a driving TFT), and has no capacitor structure. Other structures of the AMOLED-like display panel are the same as those of the AMOLED display panel. An AMOLED-like display panel is taken as an example of the display panel in the second display area 544 and is illustrated with reference to FIG. 8 below.

Figure 8:
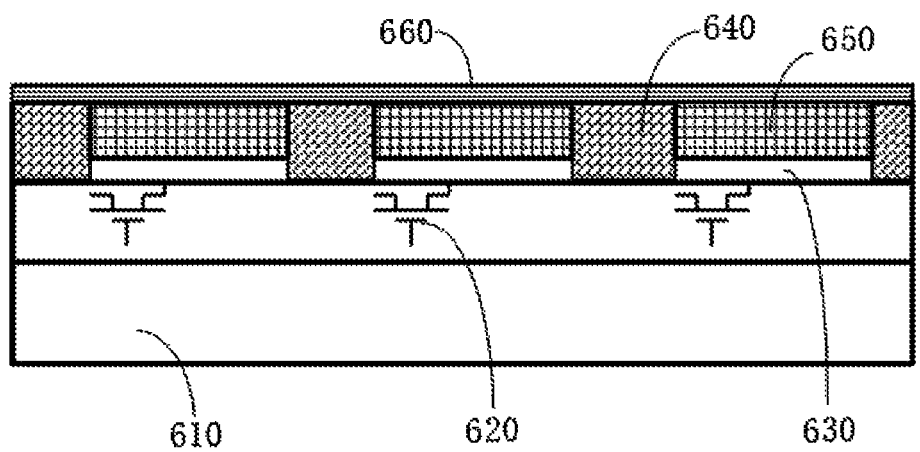
FIG. 8 is a cross-sectional diagram of an AMOLED-like display panel of an optional embodiment.

FIG. 8 is a cross-sectional diagram of an AMOLED-like display panel of an embodiment. The AMOLED-like display panel includes a substrate 610 and a pixel circuit 620 disposed on the substrate 610. A plurality of pixel circuits 620 form a TFT array. The pixel circuit 620 is provided with a first electrode layer. The first electrode layer includes a plurality of first electrodes 630, and the first electrode 630 is in a one-to-one correspondence with the pixel circuit 620. In this embodiment, the first electrode 630 is an anode. The AMOLED-like display panel further includes a pixel definition layer 640 disposed between the first electrodes 630 to define a pixel display area. The pixel definition layer 640 has a plurality of apertures, and a light emitting structure layer 650 is arranged in the apertures to form a plurality of sub-pixels. The sub-pixel is in a one-to-one correspondence with the first electrode 630. A second electrode 660 is provided on the light emitting structure layer 650. The second electrode 660 is a cathode, and the cathode is a surface electrode, that is, an entire surface electrode formed by an entire surface electrode material. The pixel circuit 620 is provided with a scanning wire, a data wire, and a TFT switching element. Both the scanning wire and the data wire are connected to the TFT switching component. The scanning wire controls the TFT switching component to turn on or to be off. When the pixel is turned on, the data wire provides a driving current for the first electrode 630 to control the sub-pixel to emit light.

The technical features of the embodiments described above can be arbitrarily combined. For the sake of brevity of description, not all possible combinations of the technical features in the aforementioned embodiments are described. However, as long as there is no contradiction between the combinations of these technical features, all should be considered as the scope of this specification.

The above embodiments merely illustrate several embodiments of the present disclosure, and the description thereof is specific and detailed, but they shall not be understood to be limitations to the protection scope of the present disclosure. It should be noted that, for those of ordinary skill in the art, various modifications and improvements can be made without departing from the concept of the present disclosure, and they all fall within the protection scope of the present disclosure. Therefore, the protection scope of the present disclosure shall be subject to the appended claims.

What is claimed is:

1. A display panel, comprising:
a first display area;
a display transition area having a plurality of display transition unit areas, the plurality of display transition unit areas including a first display transition unit area and a second display transition unit area and a third display transition unit area, the first display transition unit area being adjacent to the second display transition unit area, the first display transition unit area and the second display transition unit area being characterized by a first luminance difference of 3 nits, the third display transition unit area being adjacent to the second display transition unit area, the third display transition unit area and the second display transition unit area being characterized by a second luminance difference of 3 nits; and
a second display area, a second type of the second display area being different from a first type of the first display area;
wherein, the first display area and the second display area are disposed at two opposite sides of the display transition area respectively;
in a direction from the first display area to the second display area, the display transition unit areas are sequentially arranged adjacent to one another; and
in a full-screen display, a luminance of the first display area, a luminance of the display transition unit area and a luminance of the second display area change sequentially, and a luminance of the display transition unit areas is different;
wherein a luminance difference between adjacent display transition unit areas is greater than 1 nit.

2. The display panel according to claim 1, wherein the first type of the first display area and a third type of the display transition area are identical, and
luminance of the display transition unit area and luminance of the second display area increase sequentially; or
luminance of the display transition unit area and luminance of the second display area decrease sequentially.

3. The display panel according to claim 2, wherein, in the full-screen display, the luminance of the first display area is greater than the luminance of the second display area; and luminance of the display transition area is less than the luminance of the first display area.

4. The display panel according to claim 3, wherein in the direction from the first display area to the second display area, luminance of the display transition unit areas decreases sequentially.

5. The display panel according to claim 3, wherein a pixel aperture ratio of the display transition area is less than a pixel aperture ratio of the first display area.

6. The display panel according to claim 5, wherein in the direction from the first display area to the second display area, pixel aperture ratios of the display transition unit areas decrease sequentially.

7. The display panel according to claim 3, wherein a pixel density of the display transition area is less than a pixel density of the first display area.

8. The display panel according to claim 7, wherein in the direction from the first display area to the second display area, pixel densities of the display transition unit areas decrease sequentially.

9. The display panel according to claim 3, wherein the display panel is provided with a first drive Thin-Film Transistor (TFT) driving a pixel driving circuit of the first display area and a plurality of second drive TFTS driving pixel driving circuits of the display transition unit areas, and a channel width-to-length ratio of the first drive TFT is greater than a channel width-to-length ratio of each of the second drive TFTS.

10. The display panel according to claim 9, wherein in the direction from the first display area to the second display area, the channel width-to-length ratios of the second drive TFTS configured to drive the display transition unit area decrease sequentially.

11. The display panel according to claim 1, wherein the second type of the second display area and a third type of the display transition area are identical.

12. The display panel according to claim 1, wherein the first display area is an Active Matrix OLED (AMOLED) display area, and the second display area is a Passive Matrix OLED (PMOLED) display area or an AMOLED-like display area.

13. The display panel according to claim 12, wherein the display transition area is an AMOLED display area, and the display transition area is provided with at least one row or one column of sub-pixel area.

14. The display panel according to claim 12, wherein the second display area is partially or wholly surrounded by the first display area.

15. The display panel according to claim 12, wherein the second display area is not surrounded by the first display area.

16. The display panel according to claim 1, wherein the first display area is a Passive Matrix OLED (PMOLED) display area, and the second display area is an Active Matrix OLED (AMOLED) display area.

17. The display panel according to claim 16, wherein the display transition area is a PMOLED display area; the display transition area is provided with at least one row or one column of pixel unit area; and the pixel unit area is driven by a same anode structure.

18. A display terminal, comprising:
a device body having a component area; and
a display panel, comprising:
a first display area;
a display transition area having a plurality of display transition unit areas, the plurality of display transition unit areas including a first display transition unit area and a second display transition unit area and a third display transition unit area, the first display transition unit area being adjacent to the second display transition unit area, the first display transition unit area and the second display transition unit area being characterized by a first luminance difference of 3 nits, the third display transition unit area being adjacent to the second display transition unit area, the third display transition unit area and the second display transition unit area being characterized by a second luminance difference of 3 nits; and
a second display area, a second type of the second display area being different from a first type of the first display area;
wherein, the first display area and the second display area are disposed at two opposite sides of the display transition area respectively;
in a direction from the first display area to the second display area, the display transition unit areas are sequentially arranged adjacent to one another; and
in a full-screen display, a luminance of the first display area, a luminance of the display transition unit area and a luminance of the second display area change sequentially, and a luminance of the display transition unit areas is different;
wherein the display panel is provided on the device body;
wherein the component area is disposed below the second display area;
wherein a photosensitive component is arranged in the component area; and
wherein the photosensitive component receives light passing through the second display area.

19. The display terminal according to claim 18, wherein the photosensitive component comprises a camera and/or a sensor.

20. A display panel, comprising:
a first display area;
a display transition area having a plurality of display transition unit areas, the plurality of display transition unit areas including a first display transition unit area and a second display transition unit area and a third display transition unit area, the first display transition unit area being adjacent to the second display transition unit area, the first display transition unit area and the second display transition unit area being characterized by a first luminance difference of 3 nits, the third display transition unit area being adjacent to the second display transition unit area, the third display transition unit area and the second display transition unit area being characterized by a second luminance difference of 3 nits; and
a second display area, a second type of the second display area being different from a first type of the first display area;
wherein, the first display area and the second display area are disposed at two opposite sides of the display transition area respectively;
in a direction from the first display area to the second display area, the display transition unit areas are sequentially arranged adjacent to one another; and
in a full-screen display, a luminance of the first display area, a luminance of the display transition unit area and a luminance of the second display area change sequentially, and a luminance of the display transition unit areas is different.

* * * * *